United States Patent
Huang et al.

(10) Patent No.: US 10,186,455 B2
(45) Date of Patent: Jan. 22, 2019

(54) INTERCONNECT STRUCTURE AND METHODS OF MAKING SAME

(71) Applicant: Taiwan Semiconductor Manufacturing Company, Ltd., Hsin-Chu (TW)

(72) Inventors: Tsung-Min Huang, Taichung (TW); Chung-Ju Lee, Hsin-Chu (TW); Tsung-Jung Tsai, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/428,943

(22) Filed: Feb. 9, 2017

(65) Prior Publication Data

US 2017/0154814 A1    Jun. 1, 2017

Related U.S. Application Data

(60) Division of application No. 14/819,099, filed on Aug. 5, 2015, now Pat. No. 9,576,851, which is a
(Continued)

(51) Int. Cl.
*H01L 21/768* (2006.01)
*H01L 23/532* (2006.01)
(Continued)

(52) U.S. Cl.
CPC ...... *H01L 21/76882* (2013.01); *H01L 21/321* (2013.01); *H01L 21/324* (2013.01); *H01L 21/32133* (2013.01); *H01L 21/32136* (2013.01); *H01L 21/76802* (2013.01); *H01L 21/76816* (2013.01); *H01L 21/76879* (2013.01); *H01L 21/76883* (2013.01); *H01L 21/76885* (2013.01); *H01L 23/5226* (2013.01); *H01L 23/53233* (2013.01); *H01L 21/31144* (2013.01); *H01L 21/32139* (2013.01); *H01L 23/53228* (2013.01); *H01L 2924/0002* (2013.01)

(58) Field of Classification Search
CPC ..... H01L 23/53238; H01L 2924/01029; H01L 21/76849; H01L 21/2885; H01L 21/76858
See application file for complete search history.

(56) References Cited

U.S. PATENT DOCUMENTS 5,607,879 A * 3/1997 Wuu ................ H01L 21/31116
257/E21.252
5,686,760 A * 11/1997 Miyakawa ........ H01L 21/76843
257/751
(Continued)

*Primary Examiner* — Jaehwan Oh
(74) *Attorney, Agent, or Firm* — Slater Matsil, LLP

(57) ABSTRACT

A method of manufacturing a semiconductor interconnect structure may include forming a low-k dielectric layer over a substrate and forming an opening in the low-k dielectric layer, where the opening exposes a portion of the substrate. The method may also include filling the opening with a copper alloy and forming a copper-containing layer over the copper alloy and the low-k dielectric layer. An etch rate of the copper-containing layer may be greater than an etch rate of the copper alloy. The method may additionally include patterning the copper-containing layer to form interconnect features over the low-k dielectric layer and the copper alloy.

19 Claims, 6 Drawing Sheets

Related U.S. Application Data continuation of application No. 13/791,352, filed on Mar. 8, 2013, now Pat. No. 9,136,166.

(51) Int. Cl.
*H01L 21/3213* (2006.01)
*H01L 21/324* (2006.01)
*H01L 21/321* (2006.01)
*H01L 23/522* (2006.01)
*H01L 21/311* (2006.01)

(56) References Cited

U.S. PATENT DOCUMENTS

| | | | |
|---|---|---|---|
| 6,218,302 B1* | 4/2001 | Braeckelmann | H01L 21/76807 257/E21.508 |
| 6,291,082 B1* | 9/2001 | Lopatin | H01L 23/53238 257/750 |
| 6,333,248 B1* | 12/2001 | Kishimoto | H01L 21/31116 257/E21.252 |
| 6,342,691 B1* | 1/2002 | Johnsgard | C30B 31/12 118/50.1 |
| 6,396,151 B1* | 5/2002 | Colgan | H01L 23/5226 257/762 |
| 6,809,035 B2* | 10/2004 | Yoo | H01L 21/67109 438/709 |
| 7,351,656 B2* | 4/2008 | Sakata | C23C 16/045 257/E21.17 |
| 7,485,561 B2* | 2/2009 | Basol | H01L 21/288 257/E23.166 |
| 7,855,147 B1* | 12/2010 | Dulkin | C23C 14/022 257/E21.161 |
| 8,802,560 B1* | 8/2014 | Lu | H01L 21/321 438/631 |
| 9,136,166 B2 | 9/2015 | Huang et al. | |
| 2003/0148618 A1* | 8/2003 | Parikh | H01L 21/76807 438/694 |
| 2003/0224592 A1* | 12/2003 | Harada | H01L 21/3212 438/622 |
| 2004/0023504 A1* | 2/2004 | Yoo | H01L 21/67109 438/709 |
| 2005/0242435 A1* | 11/2005 | Werking | H01L 21/76801 257/737 |
| 2006/0014396 A1* | 1/2006 | Chen | H01L 21/31111 438/757 |
| 2006/0094221 A1* | 5/2006 | Soda | H01L 21/76808 438/597 |
| 2006/0138670 A1* | 6/2006 | Lee | H01L 21/76849 257/762 |
| 2006/0163731 A1* | 7/2006 | Inoue | H01L 21/76843 257/751 |
| 2006/0281278 A1 | 12/2006 | Min | |
| 2009/0108464 A1* | 4/2009 | Uchiyama | H01L 21/6835 257/774 |
| 2009/0117732 A1* | 5/2009 | Shin | H01L 21/7682 438/653 |
| 2009/0218694 A1* | 9/2009 | Kato | H01L 21/76843 257/751 |
| 2010/0285660 A1* | 11/2010 | Lin | C25D 5/02 438/650 |
| 2011/0006429 A1* | 1/2011 | Liu | H01L 21/76831 257/751 |
| 2011/0114940 A1* | 5/2011 | Kim | H01L 21/02554 257/43 |
| 2011/0151662 A1* | 6/2011 | Koura | H01L 21/76831 438/653 |
| 2014/0015104 A1* | 1/2014 | Su | H01L 21/225 257/611 |
| 2014/0048878 A1* | 2/2014 | Xiao | H01L 29/7816 257/343 |
| 2014/0252618 A1* | 9/2014 | Peng | H01L 21/76885 257/751 |
| 2014/0252628 A1 | 9/2014 | Huang | |
| 2017/0170386 A1* | 6/2017 | Chuang | H01L 27/228 |

* cited by examiner

INTERCONNECT STRUCTURE AND METHODS OF MAKING SAME

PRIORITY CLAIM AND CROSS-REFERENCE

The present application is a divisional of U.S. application Ser. No. 14/819,099 filed Aug. 5, 2015, and entitled "Interconnect Structure and Methods of Making same," which claims priority to and is a continuation of U.S. patent application Ser. No. 13/791,352, filed on Mar. 8, 2013, and entitled "Interconnect Structure and Methods of Making Same," which applications are incorporated herein by reference.

BACKGROUND

Since the mid-1990's so-called damascene processes have been the dominant technology for forming conductive interconnects in integrated circuits. Those skilled in the art recognize that damascene processing involves forming openings (via and trenches) in a dielectric layer and then filling the openings with a conductive, typically copper. The copper is typically deposited by initially depositing a thin seed layer within the openings and then filling the openings by electroplating copper.

FIG. 1 is a cross-sectional view of an interconnect formed on a semiconductor device from the prior art. In the figure, a patterned dielectric layer 54 is formed on a substrate 50. Formed between an opening of the patterned dielectric layer 54 and thereabove is a conductive layer 58. Formed between the dielectric layer 54 and the conductive layer 58 is a hard mask 56. A mask layer, such as a tri-layer photoresist layer 60 is formed above the conductive layer 58. In a later process, using the tri-layer photoresist layer 60 as a mask, the conductive layer 58 will be etched to form conductive lines 58 above the dielectric layer 54, as shown in FIG. 2.

The conventional copper metal line formation method can have a number of problems. One problem may be misalignment. In the process of device feature or pattern exposure, the alignment between successive layers that are being created is of critical importance. Smaller device dimensions place even more stringent requirements on the accuracy of the alignment of the successive layers that are superimposed on each other. In FIG. 2, following the etching of the conductive layer 58 in which the photoresist layer 60 is used as a mask to form conductive lines 58, via recesses VR may be formed at the juncture of a conductive line 58 and the hard mask 56 and/or the dielectric layer 54. Via recesses can be caused when the photoresist layer is misaligned (e.g., shifted to one side). Such misalignment can result from a mask misalignment failure, for example, during the photolithography process. Due to this misalignment, the via recess formed can be a serious problem in the conventional copper etch approach by causing unstable yield and decreased reliability.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Embodiments will be described with respect to a specific context, namely an interconnect structure for an integrated circuit. Other embodiments may also be applied, however, to other semiconductor devices and features. For instance, the present teachings could be applied to structures other than an integrated circuit, such as an interposer device, a printed circuit board, a package substrate, and the like.

Figure 1:
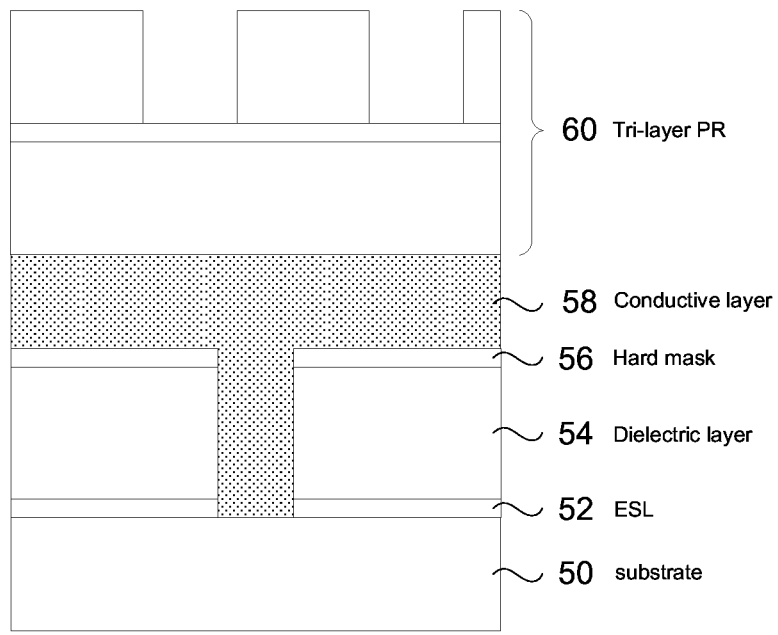
FIGS. 1 and 2 are cross-sectional views of a part of an interconnect structure of a semiconductor device from the prior art.
Figure 2:
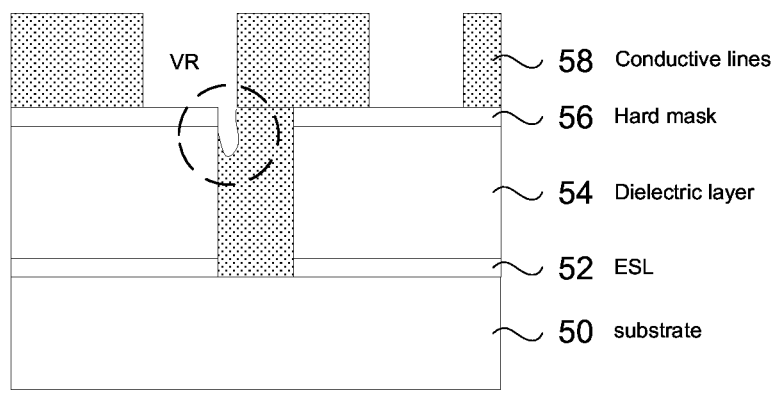
Figure 3:
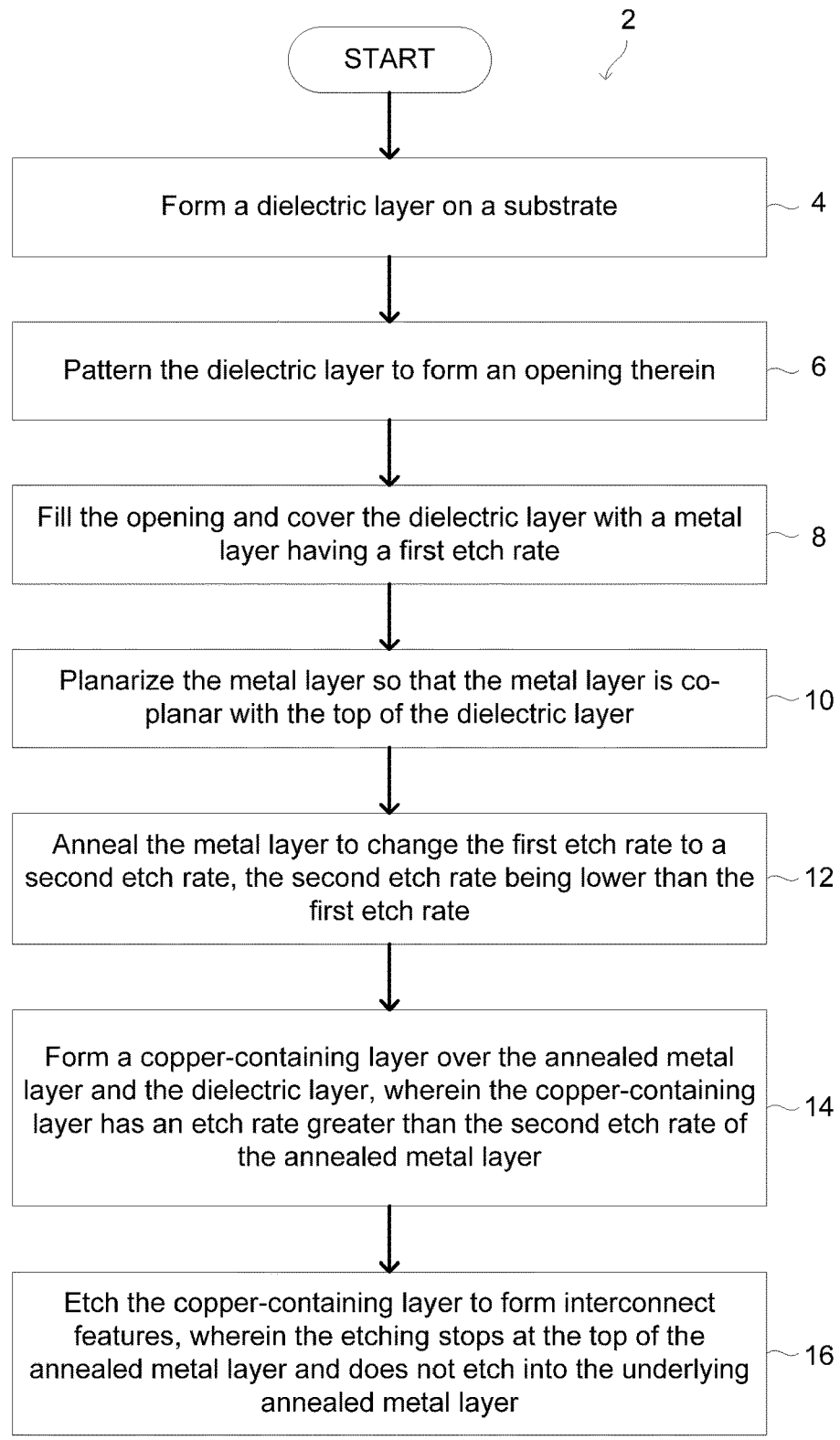
FIG. 3 is a flowchart of a method of fabricating an interconnect structure of a semiconductor device according to various embodiments of the present disclosure.

With reference now to FIG. 3, there is shown a flowchart of a method 2 for fabricating an interconnect structure of a semiconductor device according to various aspects of the present disclosure. Referring to FIG. 3, the method 2 includes block 4, in which a dielectric layer is formed on a substrate. The method 2 includes block 6, in which the dielectric layer is patterned to form an opening therein. The method 2 includes block 8, in which the opening is filled and the dielectric layer is covered with a metal layer having a first etch rate. The method 2 includes block 10, in which the metal layer is planarized so that the metal layer is co-planar with the top of the dielectric layer. It will be understood that when relative terms such as first etch rate, second etch rate, lower etch rate, etc., are used in the present disclosure, these terms are used to describe the etch characteristics of the material when exposed to a same etch process. In other words, the material etch rate prior to, e.g., annealing, when exposed to a given etch process is higher than the same materials etch rate, after annealing, when exposed to the same or a similar etch process. The method 2 includes block 12, in which the metal layer is annealed to change the first etch rate to a second etch rate, the second etch rate being lower than the first etch rate. The method 2 includes block 14, in which a copper-containing layer is formed over the annealed metal layer and the dielectric layer. The copper-containing layer has an etch rate greater than the second etch rate of the annealed metal layer. The method 2 includes block 16, in which the copper-containing layer is etched to form interconnect features. The etching stops at the top of the annealed metal layer and does not etch into the underlying annealed metal layer.

It is understood that additional processes may be performed before, during, or after the blocks 4-16 shown in FIG. 3 to complete the fabrication of the semiconductor device, but these additional processes are not discussed herein in detail for the sake of simplicity.

FIGS. 4-10 are diagrammatic fragmentary cross-sectional side views of a portion of a wafer at various fabrication stages according to embodiments of the method 2 of FIG. 3. It is understood that FIGS. 4-10 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 4:
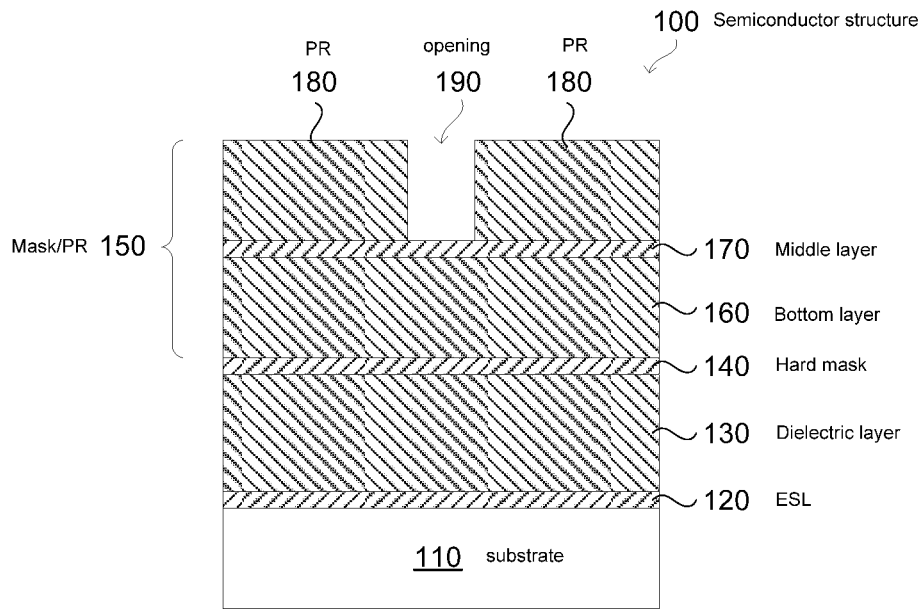
FIGS. 4-10 are diagrammatic fragmentary cross-sectional side views of a portion of a wafer at various stages of fabrication in accordance with various embodiments of the present disclosure.

With reference now to FIG. 4, there is shown an illustrative semiconductor structure too shown in highly simplified cross-sectional views. Various features not necessary for understanding of the invention have been omitted for sake of clarity and brevity. Semiconductor structure too includes a substrate 110 upon which has been formed an etch stop layer 120. Substrate 110 refers generally to any structures or materials underlying etch stop layer 120. In some applications, substrate 110 includes a semiconductor wafer such as a bulk silicon wafer or a silicon (or other semiconductor material) layer formed atop a bulk wafer and separated therefrom by, e.g., a buried oxide layer in a so-called silicon on insulator (SOI) arrangement. One or more active or passive devices, such as transistors or capacitors, could be formed in substrate 110. In another application, substrate 110 could be an underlying metal (or other conductor) layer in a multi-metal interconnect scheme. For instance, substrate 110 could be an underlying metal layer (or several stacked metal layers) manufactured according to the steps illustrated in FIGS. 4-10.

A dielectric layer 130, preferably a low-k dielectric layer 130 is formed on the etch stop layer 120. Low k generally refers to a dielectric layer having a dielectric constant of less than about 3.5. Materials such as porous silicon oxide, doped silicon oxide, silicon carbide, silicon oxynitride, and the like could be employed for dielectric layer 130, although these are examples only and are not intended to be exhaustive or limiting. The dielectric layer 130 may be formed on the etch stop layer 120 by a process such as, for example vapor deposition, plasma-enhanced chemical vapor deposition, spin on coating, or other like processes.

Hard mask 140 is formed atop dielectric layer 130. In a case where dielectric layer 130 is an oxide, hard mask 140 could be, for example, silicon nitride or another material that has a high degree of resistance to etchants typically employed to etch oxides. Other materials, such as SiCN, SiOC, and the like could also be employed for hard mask 140.

Mask 150 is formed atop hard mask 140. In the illustrated embodiment, mask 150 is a tri-layer mask comprising three separate layers. While a conventional mask layer, such as a single polymer photoresist layer, could be employed, a tri-layer mask 150 allows for the formation of finer features having smaller dimensions and pitch. In the illustrated embodiment, bottom layer 160 of tri-layer mask 150 is a carbon organic layer, similar to a conventional photoresist layer. Middle layer 170 is a silicon containing carbon film, employed to help pattern bottom layer 160. Top layer 180 is a photoresist material, such as for instance, a photoresist material designed for exposure to 193 nm wavelengths, and preferably designed for immersion photolithography, for instance.

Figure 5:
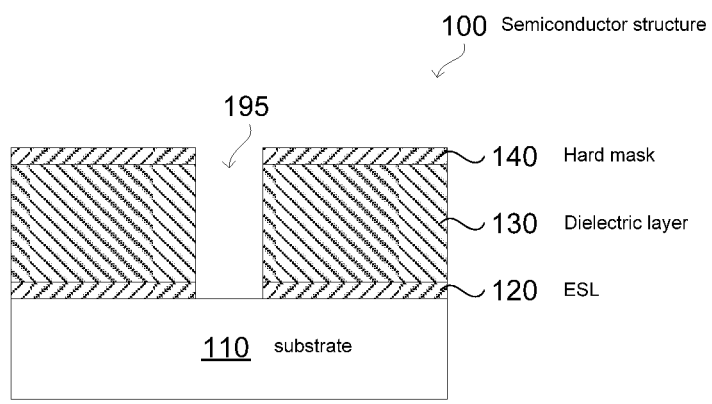

As shown in FIG. 4, an opening 190 is formed in mask 150, using known lithography techniques, such as for instance, immersion photolithography. This opening will be transferred to all layers of mask 150, through hard mask 140 and then to dielectric layer 130 and etch stop layer 120, resulting in an opening 195, sometimes referred to herein as a via opening, being formed in dielectric layer 130 and etch stop layer 120, as shown in FIG. 5. Note that opening 195 exposes an underlying portion of substrate 110 which, as described above, could be an underlying conductive interconnect, a transistor contact, or the like. Mask 150 is removed using known ashing and/or etching techniques, the details of which are omitted herein.

Figure 6:
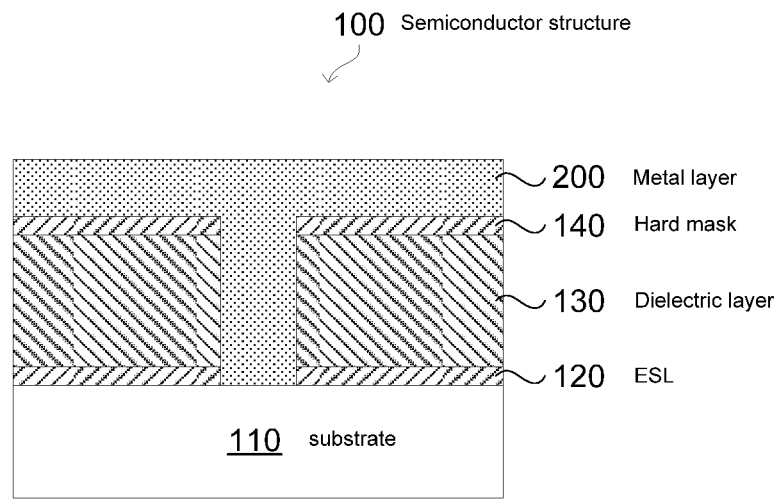

Turning now to FIG. 6, a metal layer 200 is deposited over semiconductor structure 100, the metal layer 200 having a first etch rate. In illustrated embodiments, a material of the metal layer 200 is a copper alloy. Examples of a suitable copper alloy include CuMn, CuCr, CuV, CuNb, and CuTi. The copper alloy may be in the range of from about 90% copper to about 99.8% copper. Other suitable alloys and percentages will be apparent to those skilled in the art upon undertaking routine experimentation once informed by the present disclosure. By using a copper alloy material, it is possible to manufacture copper interconnects without the need to form barrier lines, such as Ta, TaN, and the like, that are commonly employed in conventional damascene processes. That being said, it is within the contemplated scope of the present invention that a barrier liner could be employed in some applications.

In one embodiment, metal layer 200 is formed by a plasma vapor deposition (PVD) that completely fills opening 195 and forms a blanket coating over a top surface of dielectric layer 130, or more accurately over the top surface of hard mask 140 overlying dielectric layer 130. In some embodiments, hard mask 140 may be omitted, in which case metal layer 200 would be formed on dielectric layer 130. Metal layer 200 may be formed to a thickness above dielectric layer 130 of from about 500 A to about 2 um, depending upon the desired application and the technology node employed.

In another embodiment, metal layer 200 is formed by first depositing a seed layer by, e.g., physical vapor deposition techniques. The seed layer could be formed to a thickness of perhaps about 20 A to about 100 A, although other thicknesses could be employed depending upon the application and the desired process. Then a copper alloy material is formed on the seed layer using, e.g., an electro-plating or electro-less plating technique.

Figure 7:
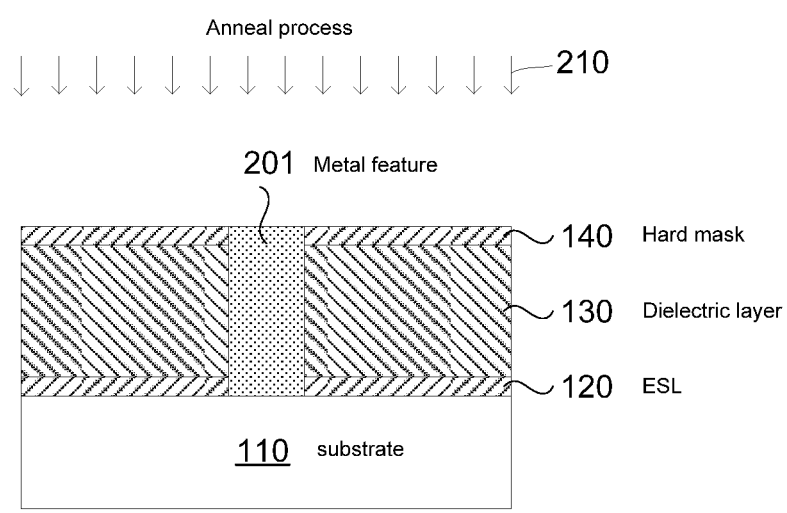
Figure 11:
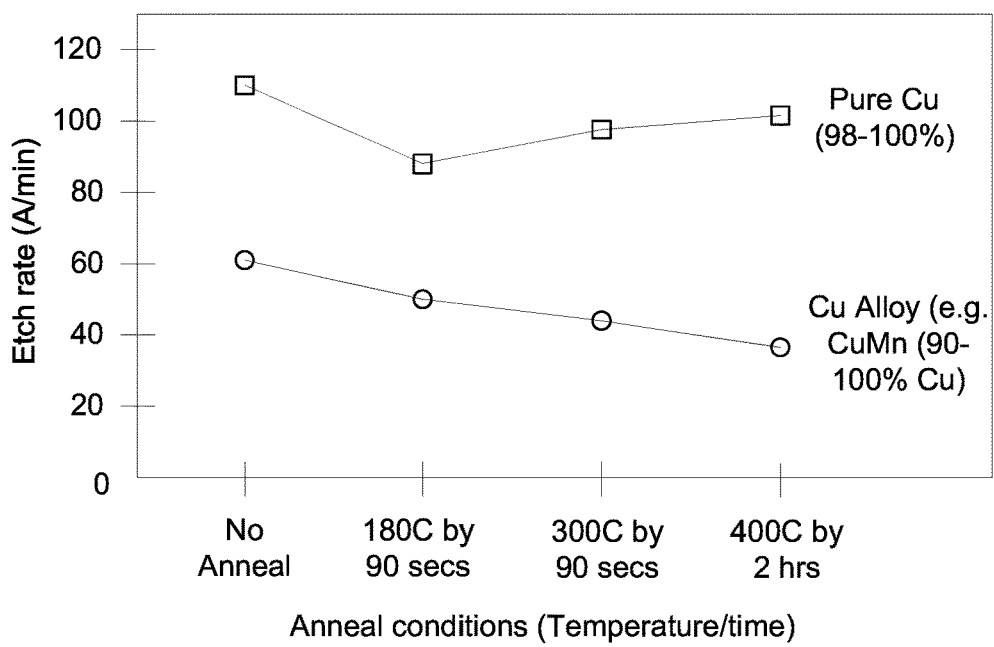
FIG. 11 is a chart showing showing different etch rates of copper alloy and pure copper at different annealing conditions.

The metal layer 200 is planarized by a chemical mechanical polishing (CMP) or an etch back step, for example to form a metal feature 201 whose top is substantially co-planar with a top surface of the hard mask layer 140, as illustrated in FIG. 7. Also shown in FIG. 7, in an aspect of the present disclosure, an anneal or heat process 210 is applied to the semiconductor structure too to control the etch rate of the copper alloy in the metal feature 201. The etch rate of the copper alloy in the metal feature 201 is changed from the first etch rate to a second etch rate, the second etch rate being lower than the first etch rate. The anneal process 210 may be a rapid thermal anneal (RTA), a laser anneal, and/or a flash lamp anneal. The anneal process may be conducted in an oxygen ambient, a combination of steam ambient and oxygen ambient combined, or under an inert gas atmosphere. The annealing may be performed in a single wafer rapid thermal annealing (RTP) system or a batch type furnace system or the anneal procedure can be performed in situ in the same tool. In an exemplary embodiment, the semiconductor structure too is placed in an inert environment, such as 95% $H_2$, 5% $N_2$ and annealed at a temperature of from about room temperature to about 400C for a time period of from about 1 minute to about 180 minutes, for example. As a result of the annealing, the copper alloy in the metal feature 201 is densified so that an etching rate of the annealed metal feature 201 is significantly reduced to be less than or equal to about 80-85 percent of an etching rate of the metal feature 201 before being annealed. The annealing can be tailored to achieve the desired etching rate. FIG. 11 is a chart showing different etch rates of copper alloy versus pure copper at different annealing conditions. This will be discussed in further detail below but as can be seen from Figure ii, the copper alloy in the metal layer 200 or the metal feature 201 has an etching rate of about 60.0 A/min before annealing. However, when the copper alloy is annealed at a temperature of about 180C, the copper alloy is densified so that the etching rate is reduced to about 52 A/min. At an annealing temperature of 300C for about 90 seconds, the etching rate of the copper alloy is further reduced to about 42 A/min. When the copper alloy is annealed at a temperature of about 400C, the copper alloy is further densified so that the etching rate is reduced further still to about 38 A/min.

Figure 8:
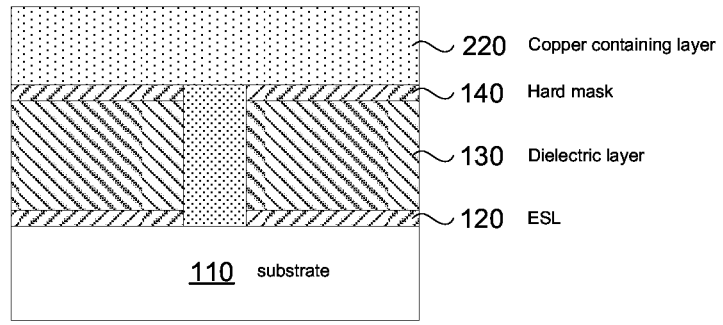

Referring now to FIG. 8, a copper containing layer 220 is deposited over the annealed metal feature 201 and the hard mask 140. In an exemplary embodiment, the copper containing layer 220 has from about 98% to about 100% copper and has an etch rate greater than the etch rate of the copper alloy in the annealed metal layer 200. The copper containing layer 220 may be deposited by plasma vapor deposition (PVD), for example. The copper containing layer 220 is thereafter thinned down (e.g., via chemical mechanical polish, CMP, by etch back, or the like).

Although not shown in FIG. 8, an etch stop layer may be formed on the planarized copper containing layer 220. In one embodiment, the etch stop layer is formed of silicon nitride, silicon carbon nitride, or another material that provides sufficient etch selectivity relative to the copper containing layer 220.

Figure 9:
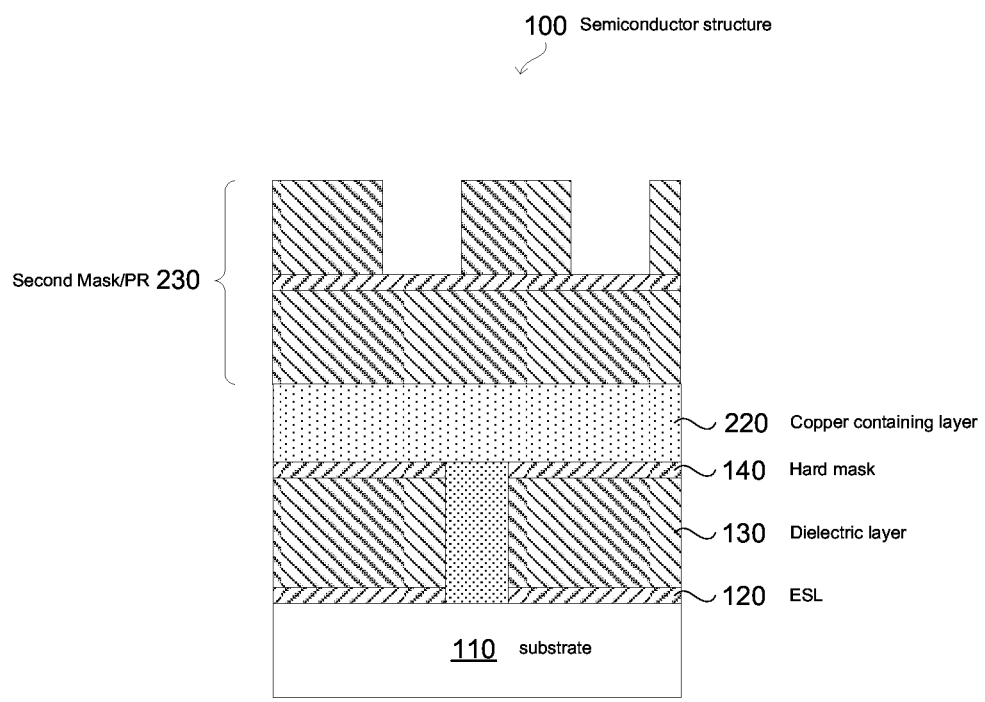
Figure 10:
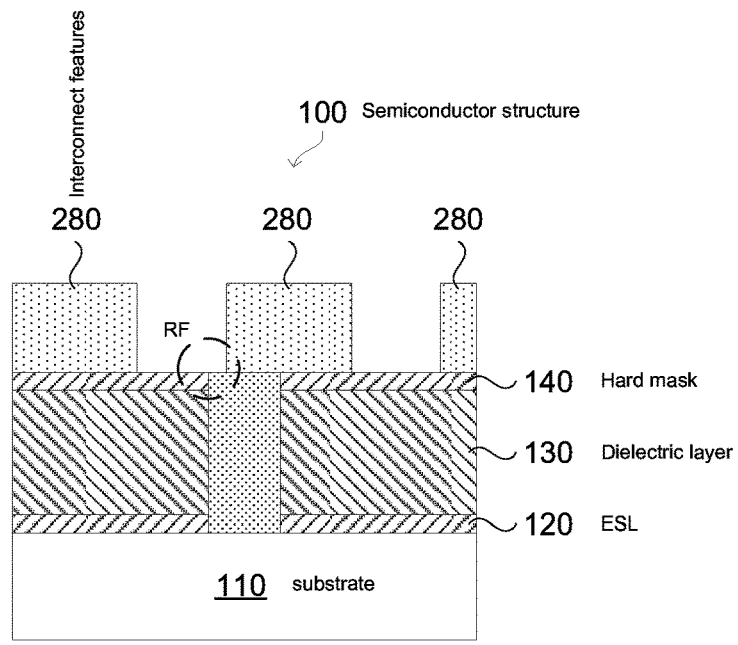

Turning now to FIG. 9, a second mask 230 is formed. In the illustrated example, mask 230 is a tri-layer mask similar to mask 150 illustrated in FIG. 4. As with the previously described steps, it is not necessary to use a tri-layer mask, unless the particular application and feature size calls for such an approach. Regardless of the type of mask employed, a pattern is formed in mask 230 as shown in FIG. 9. Next, as shown in Figure to, the pattern is transferred to copper containing layer 220 using known lithography techniques. Copper containing layer 220 is preferably etched anisotropically to form nearly vertical sidewalls. In some embodiments, a chlorine plasma etch is employed to pattern copper containing layer 220. Other plasma etches, including reactive ion etching (RIE), could also be employed.

The result of the etching step is that the copper containing layer 220 is patterned into interconnect features or interconnects 280. These interconnect features 280 run across the major surface of semiconductor structure too and may be metal lines, metal vias, or via features to provide vertical electrical routing between metal lines. The etching stops at the annealed metal feature 201 and does not etch thereunder, thus avoiding undesirable recesses that may be formed in the prior art method and resulting in a recess free (RF) semiconductor structure 100. The faster etching rate of the copper containing layer 220 is desirable because it eliminates or reduces the amount of undercutting that will occur in the annealed metal feature 201. As can be seen from Figure to, there is little or no undercutting of the annealed metal feature 201.

A reason that the etching can be accurately terminated at the top surface annealed metal feature 201 and not etch thereunder is that the etch rate of the copper alloy in the annealed metal feature 201 can be controlled, as discussed above. FIG. 11 is a chart showing different etch rates of copper alloy versus pure copper at different annealing conditions. The chart shows that the etching rate of pure copper of the copper containing layer 220 etches at a faster rate when compared to the copper alloy in the metal feature 201. Put another way, the etching selectivity of the copper containing layer 220 is higher relative to the metal layer 200 after annealing. In one aspect, the etching selectivity of the copper containing layer 220 relative to the metal layer 200 after annealing is at least 5:1. According to FIG. 11, at an annealing temperature of 180 Celsius for a time period of about 90 seconds, the etch rate of pure copper is about 85 A/min, whereas the etch rate of copper alloy is slower at about 52 A/min. And at an annealing temperature of 400 Celsius for a period of about 2 hours, the etch rate of pure copper is about 100 A/min, whereas the etch rate of copper alloy is even slower at about 38 A/min. So by controlling the annealing temperature and time, the etch rate of copper metal can be controlled, in turn accurately controlling its etch rate.

Further processing steps could include depositing a dielectric layer in the openings between the interconnect features 280 and planarizing the dielectric layer. The above described process steps may be repeated for the formation of additional vertical and horizontal interconnect features.

Although the present embodiments and their advantages have been described in detail, it should be understood that various changes, substitutions and alterations can be made herein without departing from the scope of the disclosure as defined by the appended claims.

The present disclosure has described various exemplary embodiments. According to one embodiment, an integrated circuit interconnect structure comprises a dielectric layer on a substrate. A copper alloy feature extends substantially vertically into the dielectric layer, the copper alloy feature having a first etch rate. A plurality of copper containing interconnect features on the dielectric layer and the copper alloy feature, wherein the copper containing interconnect features comprise from about 98% to about 100% copper and have a second etch rate, the second etch rate being greater than the first etch rate relative a same etch process.

According to another embodiment, A device includes a low-k dielectric layer over a semiconductor substrate, a copper alloy feature extending through the low-k dielectric layer, and a copper-containing conductive line over the low-k dielectric layer and the copper alloy feature. The copper-containing conductive line comprises substantially pure copper, and the copper containing conductive line has an etching rate greater than an etching rate of the copper alloy feature relative a same etch process.

According to yet another embodiment, a device includes a semiconductor substrate having an active device formed at a top surface, a low-k dielectric layer over the top surface of the semiconductor substrate, a conductive via extending through the low-k dielectric layer, and a conductive line forming an interface with the conductive via. The conductive via comprises a combination of copper and a material different from copper, and the conductive line comprises copper. A copper percentage of the conductive line is different than a copper percentage of the conductive via.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A semiconductor interconnect structure comprising:
a dielectric layer on a substrate;
a copper alloy feature extending substantially vertically into the dielectric layer, the copper alloy feature having a first etch rate; and
a plurality of copper-containing interconnect features on the dielectric layer and the copper alloy feature, wherein the copper-containing interconnect features comprise from about 98% to about 100% copper and have a second etch rate, the second etch rate being greater than the first etch rate relative a same etch process.

2. The semiconductor interconnect structure of claim 1, wherein the copper alloy feature comprises a material selected from the group consisting essentially of CuMn, CuCr, CuV, CuNb, CuTi, and combinations thereof.

3. The semiconductor interconnect structure of claim 1, wherein an etch selectivity of the plurality of copper-containing interconnect feature relative to the copper alloy feature is at least 5:1.

4. The semiconductor interconnect structure of claim 1 further comprising a hard mask disposed between the plurality of copper-containing interconnect features and the dielectric layer along a line perpendicular to a major surface of the substrate.

5. The semiconductor interconnect structure of claim 1 further comprising an etch stop layer under the dielectric layer, wherein the copper alloy feature extends through the etch stop layer.

6. The semiconductor interconnect structure of claim 1, wherein a density of the copper alloy feature is greater than a conductive feature having a same material composition as the copper alloy feature immediately after a deposition process.

7. A device comprising:
a low-k dielectric layer over a semiconductor substrate;
a copper alloy feature extending through the low-k dielectric layer; and
a copper-containing conductive line over the low-k dielectric layer and the copper alloy feature, wherein the copper-containing conductive line comprises substantially pure copper, and wherein the copper-containing conductive line has an etching rate greater than an etching rate of the copper alloy feature relative a same etch process.

8. The device of claim 7, wherein the copper-containing conductive line is in direct contact with the copper alloy feature.

9. The device of claim 7, wherein the copper-containing conductive line comprises about 98% to about 100% copper.

10. The device of claim 7, wherein the copper alloy feature comprises CuMn, CuCr, CuV, CuNb, CuTi, or a combination thereof.

11. The device of claim 7 further comprising an etch stop layer disposed between the low-k dielectric layer and the semiconductor substrate, wherein the copper alloy feature extends through the etch stop layer.

12. The device of claim 7, further comprising a hard mask disposed between the low-k dielectric layer and the copper-containing conductive line, wherein the copper alloy feature extends through the hard mask.

13. The device of claim 7, wherein an etch selectivity of the copper-containing conductive line relative to the copper alloy feature is at least 5:1 relative a same etch process.

14. The device of claim 7, wherein the copper alloy feature extends laterally past a sidewall of the copper-containing conductive line.

15. A device comprising:
a semiconductor substrate having an active device formed at a top surface;
a low-k dielectric layer over the top surface of the semiconductor substrate;
a conductive via extending through the low-k dielectric layer, wherein the conductive via comprises a combination of copper and a material different from copper;
a hard mask over the low-k dielectric layer, wherein the conductive via extends through the hard mask;
a second dielectric layer over the conductive via and the hard mask, wherein the second dielectric layer forms a first interface with a top surface of the conductive via; and
a conductive line in the second dielectric layer, wherein a bottom surface of the conductive line forms a second interface with the conductive via and a third interface with the hard mask, wherein the conductive line comprises copper, and wherein a copper percentage of the conductive line is greater than a copper percentage of the conductive via.

16. The device of claim 15, wherein a first etch selectivity of the conductive line is lower than a second etch selectivity of the conductive via relative a same etching process.

17. The device of claim 15, wherein the material different from copper is selected from the group consisting essentially of Mn, Cr, V, Nb, Ti, and combinations thereof.

18. The device of claim 15, wherein the conductive line comprises about 98% to about 100% copper.

19. The device of claim 15, wherein the conductive via comprises about 90% to about 99.8% copper.

* * * * *